United States Patent [19]
Kaya

[11] Patent Number: 5,338,969
[45] Date of Patent: Aug. 16, 1994

[54] UNERASABLE PROGRAMMABLE READ-ONLY MEMORY

[75] Inventor: Cetin Kaya, Dallas, Tex.

[73] Assignee: Texas Instruments, Incorporated, Dallas, Tex.

[21] Appl. No.: 722,569

[22] Filed: Jun. 27, 1991

[51] Int. Cl.$^5$ .................... H01L 29/68; H01L 29/40; G11C 7/02
[52] U.S. Cl. .................... 257/659; 257/660; 257/323; 365/53
[58] Field of Search ................ 257/659, 660, 323; 365/53

[56] References Cited

U.S. PATENT DOCUMENTS

| | | | |
|---|---|---|---|
| 4,758,984 | 7/1988 | Yoshida | 365/53 |
| 4,805,138 | 2/1989 | McElroy et al. | 257/659 |
| 5,050,123 | 9/1991 | Castro | 257/659 |
| 5,086,410 | 2/1992 | Bergemont | 365/53 |

*Primary Examiner*—Mark V. Prenty
*Attorney, Agent, or Firm*—Peter T. Rutkowski; Richard L. Donaldson; William E. Hiller

[57] ABSTRACT

An unerasable memory cell (10) is formed in the face of a layer (22) of semiconductor of a first conductivity type and includes an erasable read-only memory cell (12) having a first source/drain region (16) and a second source/drain region (18) of a second conductivity type opposite the first conductivity type. First source/drain region (16) is spaced from second source/drain region (18) by a channel area (24). A floating gate conductor (20) is disposed insulatively adjacent channel area (24) and a control gate conductor (22) disposed insulatively adjacent floating gate conductor (20). A heavily doped moat (32) of the second conductivity type laterally surrounds memory cell (12). A load device (14/66) couples moat (32) with first source/drain region (16) of a memory cell (12). A shield (46/56) is provided having a first portion (47/64) spaced from and substantially parallel to the face of semiconductor layer (22) and a second portion (52/62) formed at an angle to the face and coupling the first portion (47/64) with moat (32). Shield (46/56) substantially encloses memory cell (12).

27 Claims, 6 Drawing Sheets

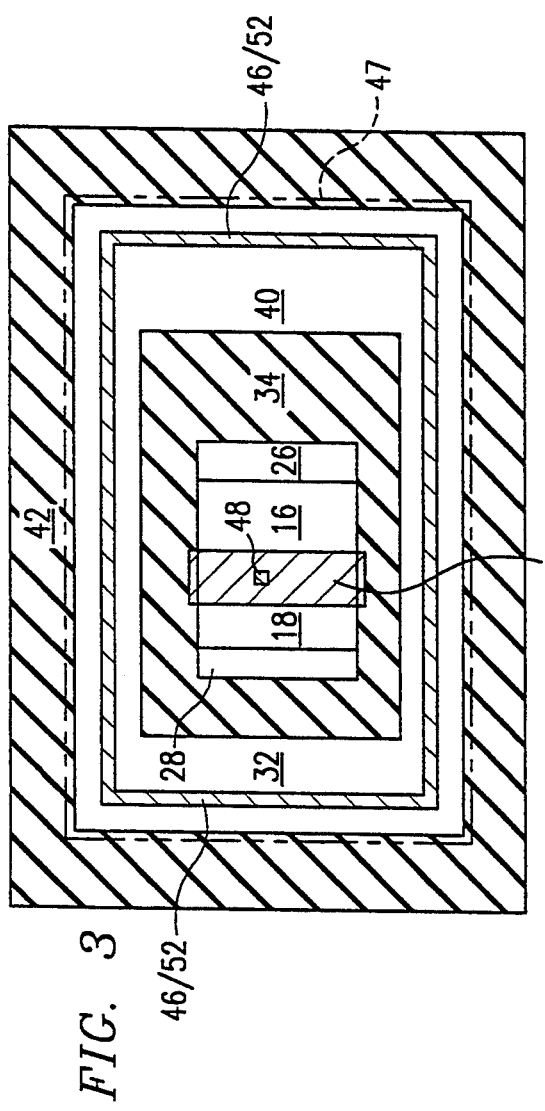
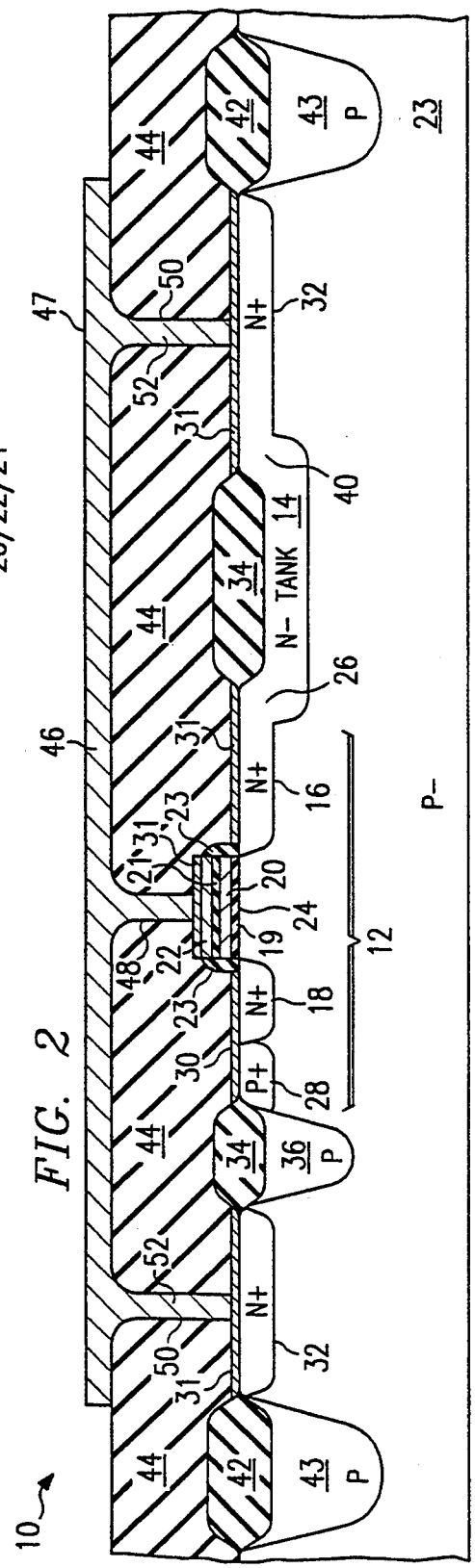
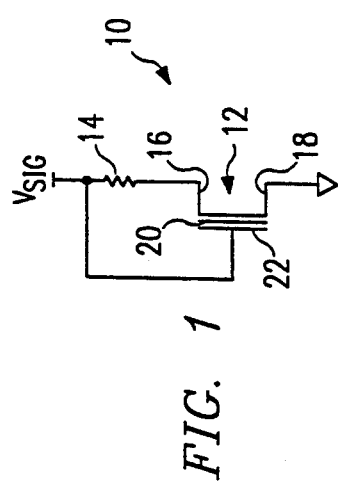

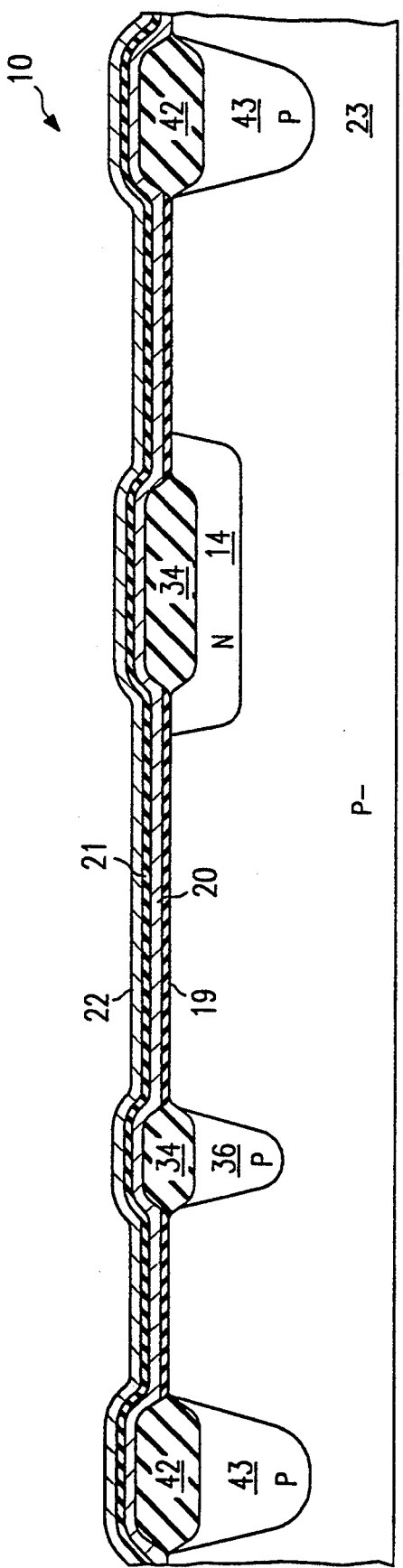
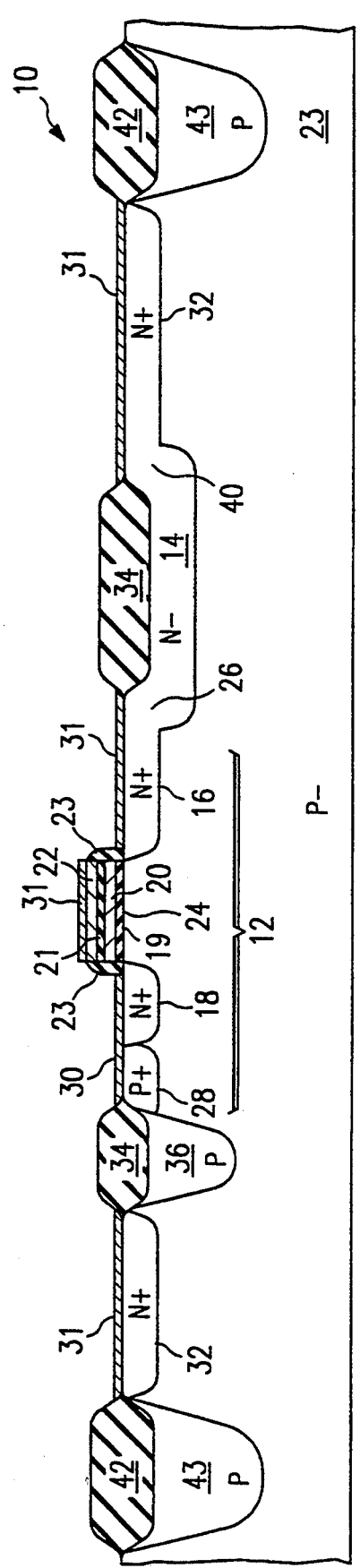
FIG. 4c
FIG. 4d

UNERASABLE PROGRAMMABLE READ-ONLY MEMORY

TECHNICAL FIELD OF THE INVENTION

The present invention relates in general to programmable read-only memories and in particular, to an unerasable electrically-programmable read-only memory.

BACKGROUND OF THE INVENTION

Erasable-programmable read-only memories (EPROMs) are non-volatile semiconductor memory devices based on metal oxide semiconductor field effect transistors (MOSFETs). EPROM cells store a bit of information as a quantity of electrons on a floating gate structure insulatively formed between the channel and the control gate of the field effect transistor. A charged floating gate raises the threshold voltage of the field effect transistor channel above the voltage normally applied to the control gate during the read operation, thereby storing a logic "0". An uncharged floating gate does not alter the threshold voltage of the channel of the field effect transistor, and therefore a normal data reading voltage will exceed the threshold voltage thereby storing a logic "1".

One structure used in semiconductor memories is an array of EPROM cells supported in a package having a window for ultraviolet erasing. Typically these EPROM cells are fabricated in a structure often referred to in the art as the floating gate avalanche injection metal oxide semiconductor (FAMOS) structure. In this structure, the floating gate is charged by the transport of electrons from the drain of the field effect transistor by avalanche injection or by channel hot electron injection. An applied high voltage pulse to the control gate induces a conductive inversion layer from source to drain. If, for example, the source is grounded and the drain is pulsed with sufficient voltage, electrons will accelerate through the inversion area in the channel from the source to the drain. A number of these electrons will gain energy from the channel electric field and create additional electron hole-pairs. Some of the electrons created during this process ("hot" electrons) have a sufficient energy level to jump over potential barrier created by the insulator between the floating gate and the channel. A percentage of these "hot" electrons will in turn be drawn to the floating gate because of the voltage induced on the floating gate due to capacitive coupling with the control gate. These electrons come to reside on the floating gate thereby charging it. Subsequently the programmed cells (et to a logic "0") in the array may be erased or returned to the logic "1" state by having their respective floating gates discharged in bulk by exposure to ultraviolet light. Ultraviolet light is directed through the window in the package such that the surface across which the memory cells are formed is exposed to the ultraviolet radiation. A portion of this ultraviolet radiation reaches the electrons on the floating gates of the charged cells. The ultraviolet radiation increases the energy of these electrons such that they exceed the potential barrier of the gate oxide separating the floating gate from the channel. After sufficient exposure, substantially all of the electrons will jump the barrier of the gate oxide and return to the substrate such that the cells are erased.

Ultraviolet erasing has a significant disadvantage in that all of the EPROM cells in the array are erased in bulk. Many times, however, it is desirable to have certain ones of the cells in the array programmed once and then left in that state despite the programming, erasing, and reprogramming of the remaining cells in the array. For example, it may be desirable to permanently set certain cells to a specific state to account for defective cells in the array or for use in associated "fixed" circuitry. One method of providing such "permanently programmed" cells is through the use of the unerasable programmable read-only memory (UPROM) cells. Currently available UPROM cells are typically conventional EPROM cells having a shield disposed between themselves and the erasing window such that during the erasing operation for the EPROM array, no ultraviolet light can reach floating gates and discharge them.

Currently available UPROM cells have the first significant disadvantage of increased size over conventional EPROM cells. In order to sufficiently protect against exposure to ultraviolet light during the erasing of the associated array, the shield must be significantly large. The shield not only must protect the floating gates from ultraviolet light directed toward the cells at a substantially perpendicular angle, but the shield must also be large enough such that ultraviolet radiation either directed toward the cell at non-perpendicular angles or reflecting off other structures on the chip will not leak in around the edges of the shield. The use of large shields in turn makes the overall size of the memory cells substantially larger than that of conventional EPROM cells substantially reducing packing density on the array. Currently available UPROM cells are also subject a second substantial disadvantage; because of the need to access the source/drain and gate of the EPROM cell, currently available UPROM cells include openings in the shield which may allow ultraviolet light to penetrate into the cell area.

Thus, the need has arisen for a UPROM cell with reduced size which also provides sufficient protection from the penetration of ultraviolet light into the cell area during an erase operation. Further, such a cell would minimize the possibility of light reaching the floating gate through openings required to access the source/drain and control gate of the memory cell. Further, the need has arisen for a UPROM cell which can be fabricated concurrently with conventional EPROM cells.

SUMMARY OF THE INVENTION

According to the invention, an unerasable memory is formed in the face of a semiconductor of a first conductivity type and includes an erasable read-only memory cell. The erasable read-only memory cell includes first and second source/drain regions formed in the face of the semiconductor of a second conductivity type opposite the first conductivity type spaced from each other by a channel area. The memory cell also includes a floating gate conductor insulatively adjacent the channel area and a control gate conductor insulatively adjacent a floating gate conductor. A heavily doped moat of the second conductivity type is formed in the face of the layer of semiconductor laterally surrounding the memory cell. A LOAD device couples the moat with the first source/drain of the memory cell. A shield is provided having a first portion formed spaced from and substantially in parallel to the face of the layer of semiconductor and a second portion formed at an angle to the face of the layer of semiconductor and coupling the first portion with the moat. The shield substantially encloses the memory cell.

The present invention reduces the size of the shield required to prevent ultraviolet light from penetrating into the memory cell when similar memory cells formed in the face of the layer of semiconductor of being erased by exposure to ultraviolet light. The present invention further minimizes the possibility of light penetrating into the memory cell by eliminating openings through the shield normally required to access the source/drain regions and the control gate of the memory cells used in conventional unerasable programmable memories. Finally, the present invention can be fabricated concurrently with conventional EPROM cells.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is an electrical schematic diagram of a first embodiment of a unerasable memory according to the principles of the present invention;

FIG. 2 is an elevational sectional schematic diagram of the first unerasable memories of claim 1 fabricated using first level metal;

FIG. 3 is a schematic plan view of the unerasable memory of FIG. 1;

FIG. 4a–4e show a series of fabrication steps for a method of fabricating the unerasable memory of FIG. 1;

DETAILED DESCRIPTION OF THE INVENTION

Figure 4A:
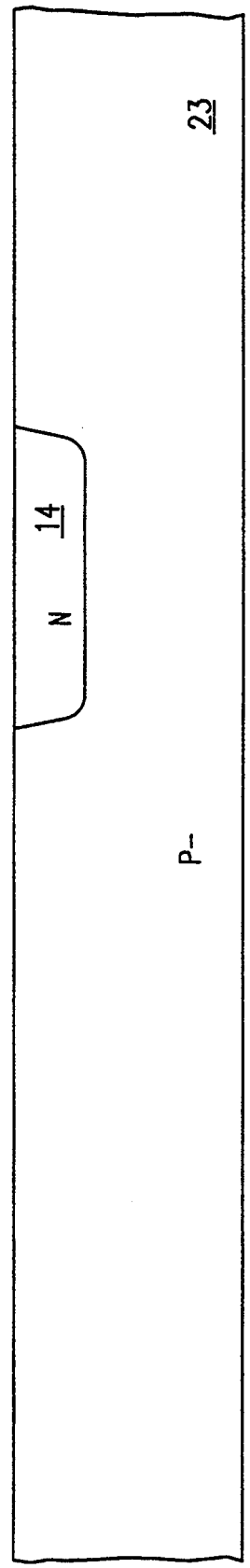

FIG. 1 is an electrical schematic of a first embodiment 10 of an unerasable programmable memory cell (UPROM) according to the invention. Memory cell 10 includes an erasable programmable memory cell (EPROM) 12, a resistor 14 and a shield (see FIG. 2). EPROM cell 12 comprises a field effect transistor with a floating gate structure and includes a first source/drain 16, a second source/drain 18, a floating gate 20, and a control gate 22. First source/drain 16 is coupled to control signal $V_{sig}$ through resistor 14. Gate 22 is also directly coupled to control signal $V_{sig}$ while second source/drain 18 is grounded. In this configuration, only the connection to control signal $V_{sig}$ is required to circuitry external to cell 10 itself.

Referring next to FIG. 2, a first fabrication option for UPROM cell 10 using a "single metal" approach is depicted. Memory cell 10 is formed in the face of a p-epitaxial layer 23 and includes heavily doped n+source/drain regions 16 and 18 spaced by a channel area 24. Floating gate 20 overlies channel 24 spaced therefrom by a layer 19 of gate oxide. Control gate 22 is spaced from floating gate 20 by an insulator layer 21. Sidewall oxides 23 are formed adjacent the edges of the stack including floating gate 20, control gate 22 and the intervening insulators 19 and 21. Resistor 14 is formed by a tank of n type material which overlaps a portion of source/drain 16 in area 26 to make the requisite source/drain-resistor coupling depicted in FIG. 1.

Heavily doped (n+) source/drain region 18 is formed directly adjacent a heavily doped (p+) contact region 28. A thin layer 30 of silicide, preferably titanium silicide (TiSi$_2$) is used to make an electrical connection between heavily doped n+region 18 and heavily doped p+region 28. Heavily doped p+region 28 and silicide layer 30 couple source/drain region 18 to the grounded p-type epitaxial layer 23 making the source/drain-ground connection shown in FIG. 1.

A moat 32 of heavily doped n+semiconductor completely laterally surrounds memory cell 12 and resistor 14. Moat 32 is separated from heavily doped p+region 28 by a p-type channel stop 36 and an overlying thick oxide layer 34. A thick oxide region 34 also overlies tank 14 and spaces source/drain region 16 from moat 32 on the opposite side of the cell. Moat 32 overlaps to n tank (resistor) 14 in area 40. Finally, field oxide regions 42 and channel stops 43 are formed adjacent moat 32 along the outside boundaries of the cell providing electrical isolation.

A layer of mid-level insulator 44 overlies the surface area of memory cell 10. First level metal 46 then makes the necessary connections to gate 22 and resistor 14 through respective contacts 48 and 50. First level metal 46 makes an electrical connection to resistor 14 (the n-tank) through moat 32.

Metal 46 provides two functions in the first embodiment. First, it makes the required electrical connections to resistor 14 and control gate 22 as shown in FIG. 1. Second, and most importantly, first level metal 46 provides the shield preventing ultraviolet light from reaching floating gate 20 to prevent the unwanted discharge of electrons. The horizontal portion of 47 of first level metal 46 can be of a substantially smaller area than the shields used in conventional UPROM cells. In other words, the horizontal portion of first level metal 46 does not have to extend substantially over oxide areas 44 around the boundaries of the cell to prevent the penetration of ultraviolet light directed toward cell 10 from non-perpendicular angles. Protection from the penetration of ultraviolet light around the edges of cell 10 is provided by the vertical portions 52 of first level metal 46 extending through areas 50. Any ultraviolet light directed at an angle to cell 10 and penetrating the outside edges of cell 10 is shredded by the vertical areas 52 of first level metal 46.

Referring next to FIG. 3, a plan view of cell 10 using single level metal 46 is depicted. Cell 10 may be encased in a layer of borophosphosilicate glass (not shown) with a single contact (also not shown) made therethrough to electrically couple first level metal 46 to control signal $V_{sig}$.

As can be seen from FIG. 3, moat 32 and field oxide 42 laterally surround memory cell 12. The vertical portion 52 of first level metal 46 provide a vertical barrier completely surrounding memory cell 12 to protect cell 12 from the penetration of ultraviolet light from non-perpendicular angles. Moat 32 provides electrical coupling to resistor 14 and EPROM cell 12 inside the shield.

FIGS. 4a–4e are a series of elevational sectional views depicting the steps of a method of fabricating memory cell 10. In FIG. 4a, n tank 14 has been formed in p type semiconductor layer 23. Tank 14 may be formed, for example, by masking the surface of semiconductor layer 23 with photoresist (not shown) and performing an implant of phosphorous at a dose of $1 \times 10^{13}$ ion/cm$^2$ at an energy of 80 KeV. The actual dosage and energy level used in fabricating tank (resistor) 14 may be varied substantially, as known in the art, to set the actual resistance of resistor 14.

Figure 4B:
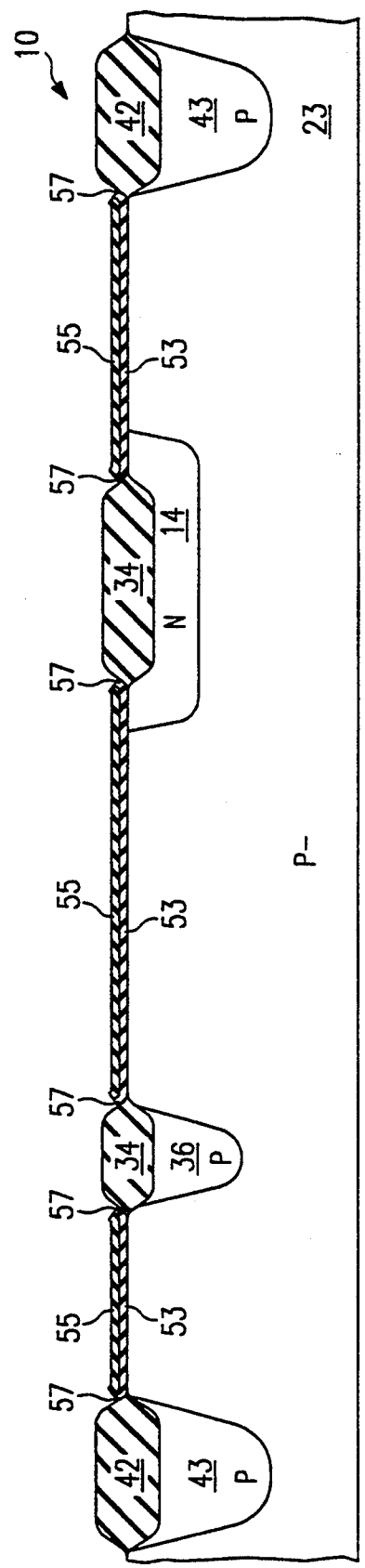

In FIG. 4b, a "hard mask" comprising a layer of oxide 53 and a layer of nitride 55 have been deposited across the face of semiconductor layer 23 and masked and etched. Following hard mask preparation (p) channel stops 36 and 43 are formed in semiconductor layer 23 by an implant of boron at a dose of approximately $8 \times 10^{12}$ ion/cm$^2$. Oxide regions 34 and 42 are next thermally grown using a localized oxidation process to a thickness of approximately 9000 angstroms by exposing the substrate to steam at about 900° C. for several hours, using any of several conventional techniques. The thermal oxide regions 34 and 42 grow beneath the edges of the adjacent nitride layer 55, creating bird's beaks 57 instead of sharp transitions.

Referring next to FIG. 4c, oxide layer 53 and nitride layer 55 are removed. Next, gate oxide layer 19 is grown across the exposed areas of p- semiconductor layer 22. This step is followed by the deposition of a first layer 20 of polycrystalline silicon (polysilicon), later to become floating gate 20, to a thickness of approximately 1500 angstroms. The polysilicon layer 20 (also known as the "poly one layer") is heavily doped to render it conductive. For example, polysilicon layer 20 may be rendered an n+type polysilicon layer by exposing it to POCL$_3$ in a thermal step at approximately 900° C. in a nitrogen/oxygen atmosphere. After polysilicon layer 20 is deglazed, interlevel insulator layer 21, such as a layer oxide/nitride/oxide, is deposited to a thickness between 150 and 500 angstroms. Finally, a second layer 22 of polycrystalline silicon (also known as the "poly two layer") is deposited to a thickness between 3000 and 4500 angstroms and is highly doped to render to it conductive as was done with poly one layer 20. Following patterning and etching, poly two layer 22 will become control gate 22.

In FIG. 4d an anisotropic etch has been performed to define the boundaries of floating gate 20, control gate 22, gate oxide layer 19 and interlevel insulator layer 21. Next, the surface of semiconductor layer 22 is masked with photoresist (not shown) and p+contact region 28 formed by implantation. Contact region 28 may be formed, for example, by an implantation of boron at a dose of approximately $3 \times 10^{15}$ ion/cm$^2$ at an energy of 30 KeV. Following the implantation of heavily doped p+region 28, the face of semiconductor layer 22 is remasked with photoresist for the implantation of the heavily doped n+regions 18, 26 and 32. This may be accomplished, for example, by an implant of arsenic at approximately $5 \times 10^{15}$ ion/cm$^2$ at an energy of 120 KeV. The stack of control gate 22, interlevel insulator 21, floating gate 20 and gate oxide 19 allows for the self-aligned implantation of the edges of source/drain regions 16 and 18 adjacent the channel region 24. The implantation of source/drain region 16 and channel region 32 form a continuous diffused area with n- channel region 14, overlapping n-tank 14 in areas 26 and 40 respectively.

Following the implantation of heavily doped n+regions 16, 18 and 32, sidewall oxides 23 are formed by a conventional method. Next, a layer of silicide 30 formed to short heavily doped n+region 18 with heavily doped p+region 28. Silicide layer 30 may, for example, be a layer of titanium silicide (TiSi$_2$) formed by sputtering the face of the workpiece with approximately 1000 angstroms of titanium and then reacting in a nitrogen atmosphere at a temperature of around 675° C. Layers 31 of titanium silicide are also formed on the surfaces diffused regions 16 and 32 and control gate 22. During the process, a layer of titanium nitride (TIN) (not shown) is formed across oxide regions 34 and 42. Later, to avoid shorts between independent nodes, any unreacted titanium and the titanium nitride is stripped away in an ammonium hydroxide (NH$_4$OH) solution.

Figure 4E:
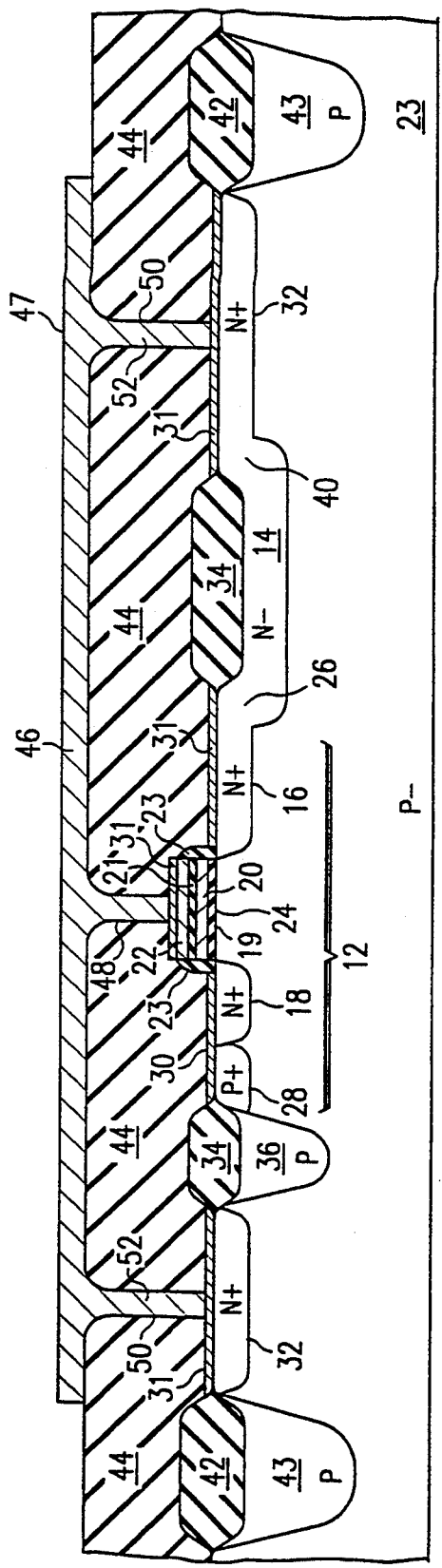

Referring next to FIG. 4e, mid-level insulator 44 has been formed across the face of the workpiece. Mid-level insulator may be, for example, borophosphosilicate glass (BPSG) or deposited silicone dioxide (SiO$_2$). Following the formation of mid-level oxide 44, contacts 48 and 50 are patterned etched to expose areas of control gate 22 and moat 32, respectively. Following the etching of contacts 48 and 50, first level metal 46 is deposited thereby providing electrical interconnection to control gate 22 and moat 32 as well as enclosing memory cell 12 in a shield.

Figure 5:
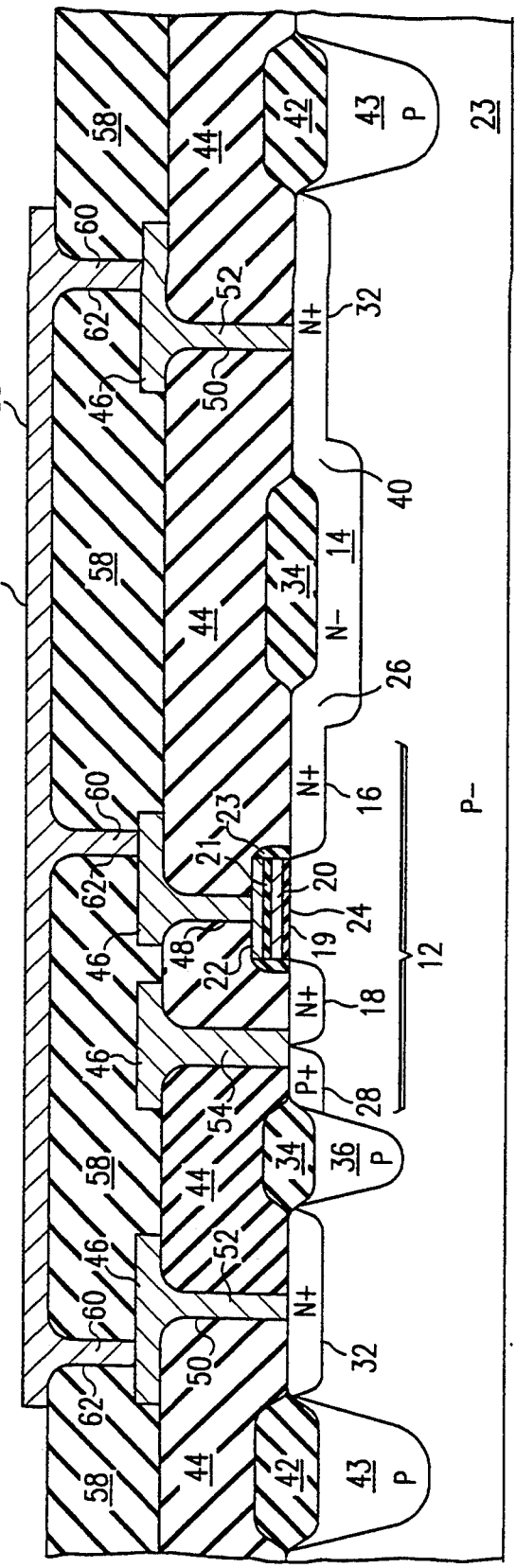
FIG. 5 is an elevational schematic diagram of the memory cell of FIG. 1 using both first and second level metal.

FIG. 5 depicts a "double-metal" approach to the first embodiment of the present invention as shown in FIG. 1. In this approach, first level metal 46 is patterned and etched after deposition across the surface of mid-level insulator 44. Further, in the depicted embodiment, first level metal 46 is extended through a contact 54 to provide the electrical connection between source/drain region 18 and p+region 28 instead of the silicide layer 30 used in the embodiment depicted in FIG. 2. Interconnection of resistor 14, moat 32 and control gate 22 with voltage supply V$_{sig}$ is made with second level metal 56. Second level metal 56 is spaced from first level metal 46 by a second layer 58 of mid-level insulator. Electrical interconnections are made to portions of patterned first level metal 46 through vertical portion 60 of second level metal 56 which extend through contact 62 made in insulator 58. As with the first level metal 46, the horizontal portion 64 of second level metal 56 provides protection from ultraviolet light directed at memory cell 12 at a substantially perpendicular angle. At the same time, vertical portions 60 of second level metal 56 and vertical portion 52 of first level metal 46 shield memory cell 12 from ultraviolet light directed at cell 12 from substantially non-perpendicular angles. As with the "first level metal" approach, the horizontal area 64 of second level metal 56 can be substantially smaller than the shields of conventional UPROM cells due to the use of vertical metal portions 52 and 60.

Figure 6:
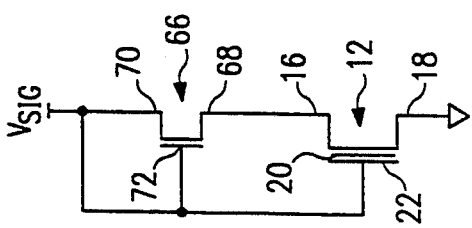
FIG. 6 is an electrical schematic diagram of a second embodiment of an unerasable memory cell using the principles of the present invention.

FIG. 6 depicts a second embodiment 65 of the present invention in which resistor 14, as shown in FIG. 1, has been replaced with a field effect transistor 66. Field effect transistor 66 include a source/drain 68 coupled to source/drain 16 of EPROM cell 12. A second source/drain 70 and the gate 72 of transistor 66 are coupled to control signal V$_{sig}$.

Figure 7:
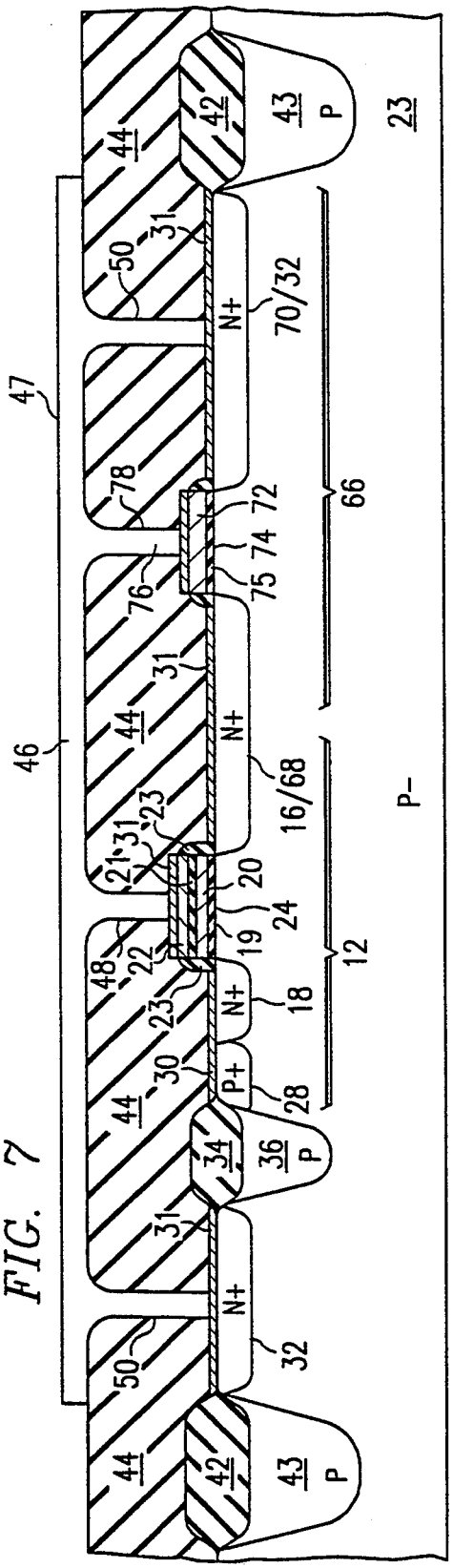
FIG. 7 is an elevational schematic diagram of the unerasable memory cell of FIG. 6 using first level metal.

FIG. 7 is a cross-sectional view of the second embodiment of the present invention shown in FIG. 6 using a "single level metal" approach. Heavily doped n+region 16 has been expanded to become the source/drain 16 of EPROM cell 12 and the source/drain 68 of field effect transistor 66. Heavily doped n+moat 32 provides source/drain 70 of transistor 66 and is spaced from source/drain region 16/68 by a channel 74. In this embodiment, thick oxide region 34 does not completely surround EPROM cell 12 and field effect transistor 66, but instead is not grown in the area required for the formation of heavily doped source/drain region 70 (see FIG. 7). Control gate 72 is spaced from channel area 74 by a gate oxide layer 75 and controls the conductance of channel 74 upon the application of a gate voltage. First level metal includes a vertical section 76 extending through a contact 78 to interconnect control gate 72 with moat/source/drain 70/32 and control gate 22 of EPROM cell 12. Vertical section 76 provides for the application of a gate voltage to gate 72. Thus, a single electrical connection (not shown) is all that is required to be made to first level metal 46 in order to apply a voltage to source/drain 70, and control gates 22 and 72.

Figure 8:
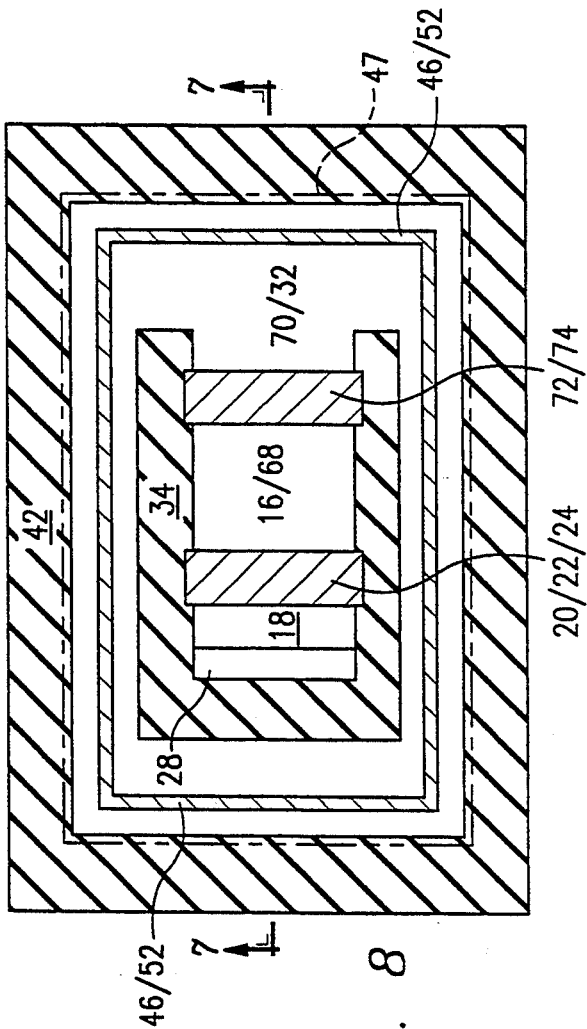
FIG. 8 is a schematic plan view of the unerasable memory cell of FIG. 7.

FIG. 8 is a top plan view of the second embodiment 65 using the "single level metal technique" shown in FIG. 6. AS is depicted in FIG. 7, field oxide region 34 is fork-shaped with moat 32 extending up to channel 74 to form the source/drain 70 for transistor 66.

Figure 9:
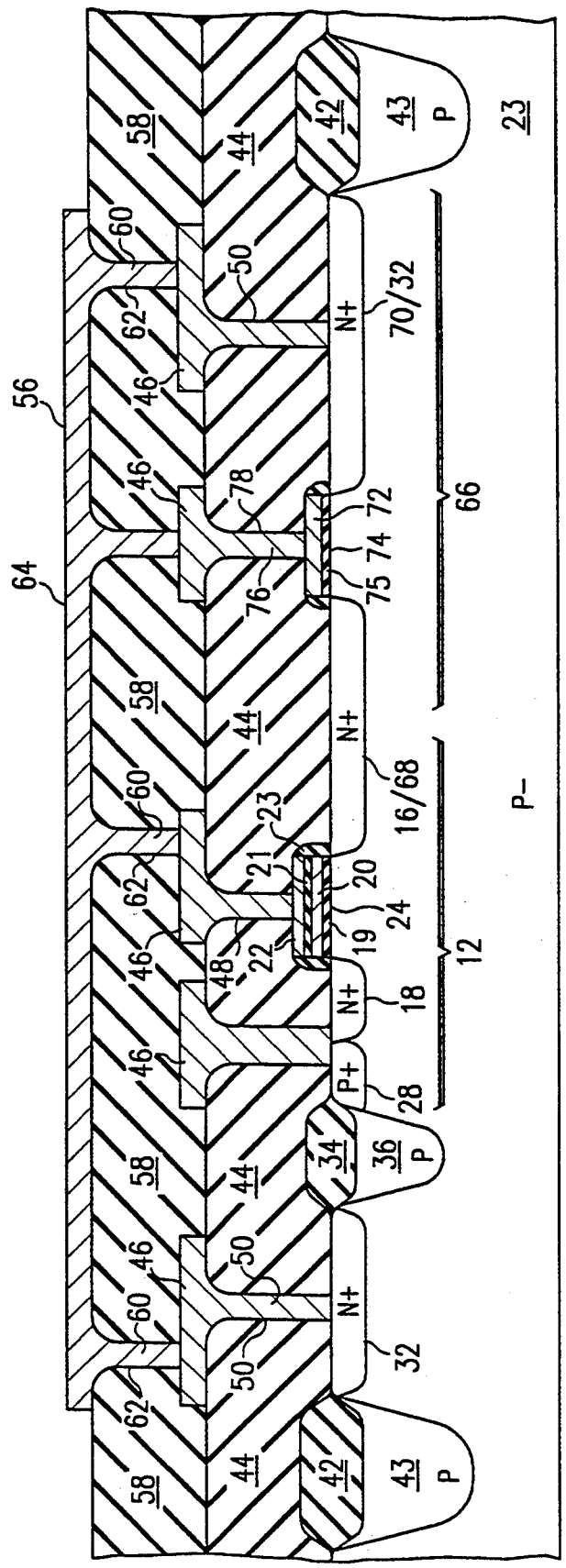
FIG. 9 is an elevational schematic diagram of the memory cell of FIG. 6 using first and second level metal.

FIG. 9 depicts the second embodiment 65 of the present invention as fabricated using the second level metal technique. As is illustrated in FIG. 9, first level metal 46 is used to make contacts to moat 32, control gate 22 of memory cell 12 and gate 72 of transistor 66, as well as providing the electrical connection between n+region 18 and p+region 28. Second level metal horizontal portion 64 and vertical portions 60 provide shielding as well as electrical interconnect between the patterned section of first level metal 46.

The operation of both cells 10 and 65 can now be described. During the write operation, approximately 12 volts is applied to the metal lines 46/56. In the first embodiment of the present invention (cell 10 of FIG. 1), the control gate 22 of EPROM cell 12 is pulled high as 12 volts is applied to metal lines 46/56. In the second embodiment, both the control gate 22 of cell 12 and the gate 72 of field effect transistor 66 are brought high along with metal lines 46/56. In each case, which is also tied to metal lines 46/56, moat 32 is brought to approximately 12 volts. Depending on the selection of the resistance of resistor 14 in the first embodiment or transistor 66 in the second embodiment, source/drain region 16 will be brought to an intermediate voltage, preferably 6 to 7 volts. With control gate 22 of EPROM cell 12 at approximately 12 volts, source/drain region 16 at 6 to 7 volts and source/drain region 18 grounded, floating gate 20 of cell 12 will be charged with electrons via channel hot electron injection.

To read EPROM cell 12, a voltage of approximately +5 volts is applied to metal lines 46/56. In the first embodiment of cell 10, control gate 22 will be brought to 5 volts as will moat 32. In the second embodiment of cell 65, control gate 22 of cell 12, gate 72 of field effect transistor 66 and moat 32 will all be raised to 5 volts. The charge on the floating gate 20 of memory cell 12 is then read by detecting the current flow being drawn through metal 46/56. For example, if floating gate 20 is uncharged, the threshold voltage of channel 24 will be exceeded by the 5 volts applied to control gate 22 and thus current will flow from moat 32 to the grounded substrate 23. On the other hand, if floating gate 20 is charged with electrons, the approximately 5 volts applied to metal 46/56 will not allow control gate 23 to exceed the threshold voltage of channel 24 and therefore little or no current flow will occur between metal 46/56 through moat 32 to the grounded substrate 23.

While preferred embodiments of the invention and their advantages have been set forth in the above-detailed description, the invention is not limited thereto, but only by the scope and spirit of the appended claims.

What is claimed is:

1. An unerasable memory formed in the face of a layer of semiconductor of a first conductivity type comprising:
   an unerasable read only memory cell having first and second source/drain regions formed in said face of a second conductivity type opposite said first conductivity type spaced by a channel area, a floating gate conductor insulatively adjacent said channel area, and a control gate conductor insulatively adjacent said floating gate conductor;
   a heavily doped moat formed in said face of said second conductivity type laterally surrounding said memory cell;
   a load device coupling said moat with said first source/drain of said memory cell; and
   a shield having a first portion formed spaced from and substantially in parallel to said face, and a second portion formed at an angle to said face and coupling said first portion with said moat, said shield enclosing said memory cell.

2. The memory cell of claim 1, wherein said load device comprises a resistor.

3. The memory cell of claim 2, wherein said resistor comprises a tank formed in said face of said second conductivity type, said tank having a first portion continuous with said first source/drain and a second portion continuous with said moat.

4. The memory cell of claim 1, wherein said shield further includes a third portion coupling said first portion with said control gate of said memory cell.

5. The memory cell of claim 1, wherein said load device comprises a field effect transistor having first and second source/drain regions formed in said face of said second conductivity type spaced by a channel, and a control gate.

6. The memory cell of claim 5, wherein said first source/drain of said memory cell further comprises said first source/drain region of said field effect transistor.

7. The memory cell of claim 5, wherein a portion of said moat comprises said second source/drain region of said field effect transistor.

8. The memory cell of claim 5, wherein said shield further includes a third portion coupling said first portion with said gate of said field effect transistor.

9. The memory cell of claim 1, wherein said shield is coupled to a voltage supply.

10. The memory cell of claim 1, wherein said second source/drain of said memory cell is grounded.

11. An unerasable memory formed in the face of a layer of semiconductor of a first conductivity type comprising:
   a memory cell comprising:
   a first heavily doped source/drain region formed in said face of a second conductivity type opposite said first conductivity type;
   a second heavily doped source/drain region formed in said face of said second conductivity type spaced from said first source/drain region by a channel area;
   a heavily doped contact region formed in said face of said semiconductor layer adjacent said second source/drain region of said first conductivity type;

a floating gate conductor disposed insulatively adjacent said channel area; and a control gate conductor disposed insulatively adjacent said floating gate conductor;

a heavily doped moat region formed in said face of said second conductivity type, said moat laterally surrounding said memory cell;

a tank formed in said face of said second conductivity type, said tank resistively coupling said moat region with said first source/drain of said memory cell; and a shield having a first portion formed spaced from and substantially in parallel to said face and coupling said first portion with said moat, said shield enclosing said memory cell.

12. The unerasable memory cell of claim 11 and further comprising a conductor electrically coupling said contact region and said second source/drain region.

13. The unerasable memory of claim 11, wherein said shield comprises first level metal.

14. The unerasable memory of claim 11, wherein said shield comprises first and second level metal.

15. The unerasable memory of claim 12, wherein said conductor comprises a layer of silicide.

16. The unerasable memory of claim 12 wherein said conductor comprises first level metal.

17. The unerasable memory of claim 11, wherein said first conductivity type comprises p-type and said second conductivity type comprises n-type.

18. The unerasable memory of claim 11 and further comprising a first thick insulator region adjacent to said moat, said first thick insulator region surrounding said moat laterally and spaced from said memory cell.

19. The unerasable memory of claim 18 and further comprising a second thick insulator region adjacent to said moat, a first portion of said second thick insulator spacing said moat from said contact region and a second portion of said second thick insulator region spacing said moat from said first source/drain of said memory cell.

20. The unerasable memory of claim 19, wherein said layer of semiconductor is grounded.

21. An unerasable memory formed in the face of a layer of semiconductor of a first conductivity type comprising:

a first heavily doped source/drain region formed in said face of a second conductivity type opposite said first conductivity type;

a second heavily doped source/drain region formed in said face of said second conductivity type spaced from said first source/drain region by a first channel area;

a heavily doped contact region of said first conductivity type disposed adjacent said second source/drain region;

a conductor electrically coupling said contact region and said second source/drain region;

a floating gate conductor disposed insulatively adjacent said channel area;

a control gate conductor disposed insulatively adjacent said floating gate;

a heavily doped moat region formed in said face of said second conductivity type, said moat laterally surrounding said memory cell, a portion of said moat region spaced from said first source/drain region by a second channel area;

a gate conductor disposed insulatively adjacent said second channel area;

an interconnection conductor having a first portion formed spaced from and substantially in parallel to said face, a second portion formed at an angle to said face and coupling said first portion with said moat, a third portion formed at an angle to said face and coupling said control gate with said first portion and a fourth portion formed at an angle to said face and coupling said gate with said first portion, said interconnection conductor forming a shield enclosing said memory cell.

22. The unerasable memory of claim 21, wherein said layer of semiconductor is grounded.

23. The unerasable memory of claim 21 and further comprising a first thick insulator region spacing said contact region and said moat.

24. The unerasable memory of claim 23 and further comprising a second thick insulator region disposed adjacent an outer periphery of said moat.

25. The unerasable memory of claim 21, wherein said interconnection conductor comprises first level metal.

26. The unerasable memory of claim 21, wherein said interconnection conductor comprises first and second level metal.

27. An integrated circuit formed in the face of a layer of semiconductor of a first conductivity type comprising:

at least one erasable read-only memory cell formed in said face; and at least one unerasable memory formed in said face comprising:

a memory cell having first and second source/drain regions formed in said face of a second conductivity type opposite said first conductivity type spaced by a channel area, a floating gate conductor insulatively adjacent said channel area, and a control gate conductor insulatively adjacent said floating gate conductor;

a heavily doped moat formed in said face of said second conductivity type laterally surrounding said memory cell;

a load device coupling said moat with said first source/drain of said memory cell;

a shield having a first portion formed spaced from and substantially in parallel to said face, and a second portion formed at an angle to said face and coupling said first portion with said moat, said shield enclosing said memory cell.

* * * * *